(12) United States Patent
Wang (10) Patent No.: US 8,325,951 B2
(45) Date of Patent: Dec. 4, 2012

(54) MINIATURE MEMS CONDENSER MICROPHONE PACKAGES AND FABRICATION METHOD THEREOF

(75) Inventor: Yunlong Wang, Sunnyvale, CA (US)

(73) Assignee: General MEMS Corporation, Sunnyvale, CA (US)

( * ) Notice: Subject to any disclaimer, the term of this patent is extended or adjusted under 35 U.S.C. 154(b) by 369 days.

(21) Appl. No.: 12/689,283

(22) Filed: Jan. 19, 2010

(65) Prior Publication Data

US 2010/0183181 A1 Jul. 22, 2010

Related U.S. Application Data

(60) Provisional application No. 61/145,826, filed on Jan. 20, 2009.

(51) Int. Cl.
*H04R 25/00* (2006.01)

(52) U.S. Cl. .......................... 381/175; 381/369

(58) Field of Classification Search .......... 381/174–176, 381/369, 191; 367/170, 180
See application file for complete search history.

(56) References Cited

U.S. PATENT DOCUMENTS

| | | | |
|---|---|---|---|
| 5,146,435 A | 9/1992 | Bernstein | |
| 5,452,268 A | 9/1995 | Bernstein | |
| 5,619,476 A | 4/1997 | Haller | |
| 5,870,351 A | 2/1999 | Ladabaum | |
| 5,894,452 A | 4/1999 | Ladabaum et al. | |
| 6,493,288 B2 | 12/2002 | Khuri-Yakub et al. | |
| 6,535,460 B2 | 3/2003 | Loeppert | |
| 6,781,231 B2 | 8/2004 | Minervini | |
| 6,870,937 B1 | 3/2005 | Hirosaki et al. | |
| 7,409,616 B1 | 8/2008 | Sardi | |
| 7,434,305 B2 | 10/2008 | Minervini | |
| 7,466,834 B2 * | 12/2008 | Ogura et al. | 381/174 |
| 2005/0018864 A1 | 1/2005 | Minervini | |

* cited by examiner

*Primary Examiner* — Suhan Ni
(74) *Attorney, Agent, or Firm* — McClure, Qualey & Rodack, LLP (57) ABSTRACT

MEMS microphone packages and fabrication methods thereof are disclosed. A MEMS microphone package includes a cavity that houses a MEMS sensing element, an IC chip and other passive elements supported by a common substrate. The cavity is formed by a top cover member, a housing wall surrounds and supports the top cover member and the common substrate supports the housing wall. A conductive casing encloses and surrounds the cavity, and is electrically connected to a common analog ground lead on a PCB board. The top cover member and the housing wall are non-conductive. And the conductive casing is not connected directly to the ground leads of the package. An acoustic absorption layer is sandwiched between the conductive casing and the cavity which is formed by the top cover member, the housing wall and the substrate.

12 Claims, 12 Drawing Sheets

MINIATURE MEMS CONDENSER MICROPHONE PACKAGES AND FABRICATION METHOD THEREOF

CROSS REFERENCE TO RELATED APPLICATIONS

This application is based upon and claims the benefit of priority from a prior U.S. Provisional Application No. 61/145,826, filed on Jan. 20, 2008, the entire contents of which is incorporated herein by reference.

BACKGROUND OF THE INVENTION

1. Field of the Invention

The invention relates to micromachined acoustic device packages and in particular to micromachined miniature MEMS microphone packages and fabrication methods thereof.

2. Description of the Related Art

Micromachined silicon microphones have been disclosed in many patents. For example, U.S. Pat. Nos. 5,619,476, 5,870,351, 5,894,452 and 6,493,288 disclose capacitive-type ultrasonic transducer fabrication methods. U.S. Pat. Nos. 5,146,435; 5,452,268; 6,535,460 and 6,870,937 disclose micromachined capacitive transducers that are mainly used for sound pickups. In these patents, however, inventiveness has focused on the design and manufacturing of micromachined microphone dies. In other words, inventiveness has focused on the wafer level processing of microphones.

For microphones to be used in any type of electronic devices, proper housing needs to be provided such that the microphone dies can be housed in a suitable package to prevent it from environmental interferences. Preferably, this housing structure also shields the sensing elements of a silicon microphone from outside electromagnetic interferences. Also, the packaged microphones need to have contact leads, such that the contact leads can be soldered onto an electronic board where they are used. Lastly, the packaging method used for the microphones, must be low cost and allow for mass production.

Compared with traditional electret microphones, micromachined MEMS microphones have the advantage of being able to sustain high re-flow temperatures. Thus, to minimize electronic products assembly costs, the micromachined MEMS microphones are packaged in form factors that allows for the surface mounting of microphones to a PCB board.

Several packaging methods for MEMS microphones have been disclosed. U.S. Pat. No. 6,781,231, the entirety of which is hereby incorporated by reference, discloses a micro-electro-mechanical system package including a micro-electro-mechanical system microphone, a substrate, and a cover. The substrate has a surface for supporting the micro-electro-mechanical microphone. The cover includes a conductive layer having a center portion bounded by a peripheral edge portion. A housing element is formed by connecting the peripheral edge portion of the cover to the substrate. The center portion of the cover is spaced from the surface of the substrate to accommodate the micro-electro-mechanical system microphone. The housing includes an acoustic port for allowing an acoustic signal to reach the micro-electro-mechanical system microphone. U.S. Patent application publication 2005/0018864, the entirety of which is hereby incorporated by reference, discloses a silicon condenser microphone package comprising a transducer unit, a substrate, and a cover. The substrate includes an upper surface having a recess formed therein. The transducer unit is attached to the upper surface of the substrate and overlaps with at least a portion of the recess wherein a back volume of the transducer unit is formed between the transducer unit and the substrate. The cover is placed over the transducer unit and includes an aperture.

U.S. Pat. No. 7,434,305, the entirety of which is hereby incorporated by reference, discloses a silicon condenser microphone package comprising a transducer unit, substrate, and a cover. The substrate includes an upper surface having a recess formed therein. The transducer unit is attached to the upper surface of the substrate and overlaps with at least a portion of the recess wherein a back volume of the transducer unit is formed between the transducer unit and the substrate. The cover is placed over the transducer unit and includes an aperture.

U.S. Pat. No. 7,439,616, the entirety of which is hereby incorporated by reference, discloses a silicon condenser microphone package including a transducer unit, a substrate, and a cover. The substrate, including an upper surface transducer unit, is attached to the upper surface of the substrate and overlaps with at least a portion of the recess wherein a back volume of the transducer unit is formed between the transducer unit and the substrate. The cover is placed over the transducer unit and either the cover or the substrate includes an aperture.

The mentioned packaging methods provide a silicon condenser microphone package that allows acoustic energy to contact a transducer disposed within a housing. The housing provides necessary pressure references, while at the same time, protects the transducer from light, electromagnetic interference and physical damage. The mentioned packaging methods, however, fail to critically address aspects of packaged microphones related to usage and assembly thereof. Some aspects include, but are not limited to, acoustic leakage through sidewalls and/or a cover of the microphone package, secure microphone attachment to an underlying PCB board, effectiveness of shielding from electromagnetic interference, electronic signal transmission distortion from the microphone package to the underlying PCB board, flexibility of a packaged microphone for surface mounting; and ease of manufacturing for volume production, etc.

BRIEF SUMMARY OF THE INVENTION

An embodiment of the invention provides a MEMS microphone package, comprising: a cavity enclosed by a top cover part, wherein a housing wall part surrounds and supports the top cover part, and a substrate supports the housing wall part and the cover part; a MEMS sensing element and an IC chip disposed inside of the cavity; an opening comprising an acoustic passage connecting the cavity to an ambient space; and a conductive casing disposed enclosing the top cover part and the housing wall, wherein the conductive casing is soldered to a PCB board and is electrically connected to a common analog ground lead on the PCB board.

Another embodiment of the invention provides a method for fabricating a MEMS microphone package, comprising: providing a substrate; forming a cavity enclosed by a top cover part, wherein a housing wall part surrounds and supports the top cover part, and a substrate supports the housing wall part and the cover part; forming a MEMS sensing element and an IC chip inside the cavity; forming an opening comprising an acoustic passage connecting the cavity to an ambient space; and forming a conductive casing disposed enclosing the top cover part and the housing wall, wherein the conductive casing is soldered to a PCB board and is electrically connected to a common analog ground lead on the PCB board.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

It is to be understood that the following disclosure provides many different embodiments, or examples, for implementing different features of various embodiments. Specific examples of components and arrangements are described below to simplify the disclosure. These are merely examples and are not intended to be limiting. In addition, the disclosure may repeat reference numerals and/or letters in the various examples. This repetition is for the purpose of simplicity and clarity and does not in itself indicate a relationship between the various embodiments and/or configurations discussed. Moreover, the formation method for a first feature over or on a second feature in the description that follows may include embodiments in which the first and second features are formed in direct contact or not in direct contact.

Main features and key aspects of embodiments of the invention provide a MEMS microphone package having a conductive casing that is electrically connected to a common analog ground lead of a supporting PCB board to shield a sensing element from the environment and electromagnetic interferences. In one embodiment, a MEMS microphone package has a strong bonding strength between a microphone package and a supporting PCB substrate due to the connection of the conductive casing to the supporting PCB substrate. Embodiments of the invention also provide a MEMS microphone package that is not vulnerable to temperature fluctuations which may occur during the packaging and assembly process. Other embodiments of the MEMS microphone package of the invention further enhance acoustic signal transmittances to the sensing element housed in the package.

The foregoing and other objectives of the invention are achieved by a surface mountable MEMS microphone package including a transducer element, IC chips and other passive elements supported by a substrate housed in a cavity formed by the substrate. A housing wall and a cover member have an opening to allow acoustic signals to pass therethrough and reach the membrane of a MEMS sensing element. The substrate, housing wall and cover member are stacked and bonded together to form a cavity that minimally alters the acoustic response of the MEMS sensing element. A conductive casing is provided surrounding and enclosing the housing wall and cover plate of the microphone package. An acoustic absorbing material is provided and interposed between the conductive casing and the housing wall as well as the top cover plate of the microphone package. The conductive casing can be soldered to the PCB substrate that supports the microphone package, and electrically connected to a common analog ground lead on the PCB substrate to form a shield for the microphone from the environment and electromagnetic interferences.

Meanwhile, a different approach is disclosed for packaging of the MEMS microphone when compared to prior art. The package of the MEMS microphone of the invention is both acoustically sound and mass producible. The MEMS microphone of the invention can be considered as an individual device and an integral component. The packaging method according to some embodiments of the invention minimally alters the acoustic response of a microphone after it is packaged. At the same time, the packaging method outlined according to some embodiments of the invention provides minimal distortion for the transmission of electronic signals from the packaged microphone to an attached motherboard. The microphone package according to some embodiments of the invention provides mechanical shielding from the environmental and electromagnetic interferences.

Figure 1:
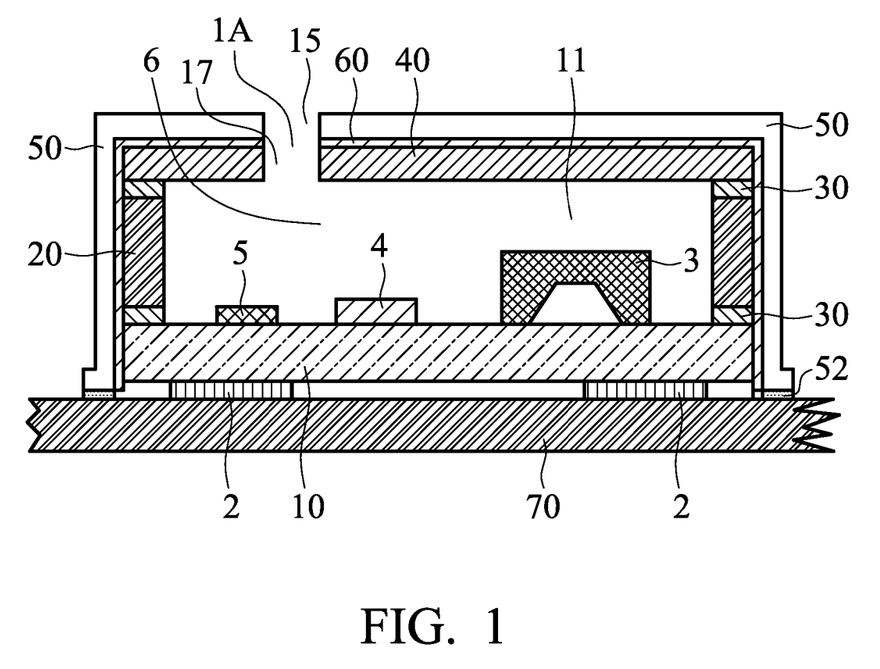
FIG. 1 is a cross-sectional view of a microphone package, being surface-mounted on a supporting PCB substrate, according to embodiment of invention.

Referring now to FIG. 1, the MEMS microphone package according to an embodiment of the invention includes a substrate 10 on which a MEMS acoustic sensing element 3, an IC chip 4 and passive component 5 are mounted. An acoustic cavity 6 is formed by the substrate 10, housing walls 20 and a cover member 40. The attachment of the housing wall 20 and cover member 40 to the substrate 10 is realized using glue 30 which is applied between the substrate 10 and the housing wall 20, and between the housing wall 20 and the cover member 40. The height of housing wall 20 is large enough such that there is enough clearance 11 between the top surface of MEMS sensing element 3 and the cover member 40. Soldering pads 2 are formed at the bottom of the substrate 10 to allow the packaged MEMS microphone to be surface mountable onto the PCB board 70. The substrate 10 can be made of FR-4 material to match the thermal property of the PCB board 70. The cover member 40 has an opening 1A to allow acoustic signals to pass therethrough to reach the surface of MEMS sensing element 3. In one embodiment, the opening 1A is formed in and extended through the cover member 40. The opening 1A comprises an acoustic passage 17 connecting the cavity to an ambient space. The location of opening 1A is chosen such that it is away from the sensing element 3 to protect dust from falling onto or moisture, such as from the mouth of a human, to reach the surface of the sensing element 3.

Referring to FIG. 1 further, a conductive casing 50 surrounds and encloses the microphone package. In one embodiment, an acoustic opening 15 formed in the conductive casing 50 is aligned with the opening 1A to allow acoustic signals to pass therethrough. An acoustic absorption layer 60 is inserted between the microphone housing wall 20 and/or top cover member 40 and the conductive casing 50. The conductive casing 50 is thus not directly connected to either the analog or digital ground of the microphone package. It is instead electrically connected to a common analog ground lead on a PCB board 70 through soldering pads 52.

While the casing 50 is made of metal or other electrically conductive materials, the housing wall 20 and the cover member 40 are generally made of plastics or FR-4 materials that are electrically insulated. The material of the acoustic absorption layer 60 may comprise foam, cork, sponge, rubber, or spray-on silicone coating.

According to another embodiment of the invention, a method for fabricating a MEMS microphone package is provided. The fabrication method comprises the steps of providing a substrate, and forming a cavity enclosed by a top cover part, wherein a housing wall part surrounds and supports the top cover part, and the substrate supports the housing wall part and the cover part. Also, a MEMS sensing element and an IC chip is formed inside of the cavity and an opening comprising an acoustic passage connecting the cavity to an ambient space is formed along with a conductive casing enclosing the top cover part and the housing wall. The conductive casing is soldered to a PCB board and is electrically connected to a common analog ground lead on the PCB board.

Figure 2A:
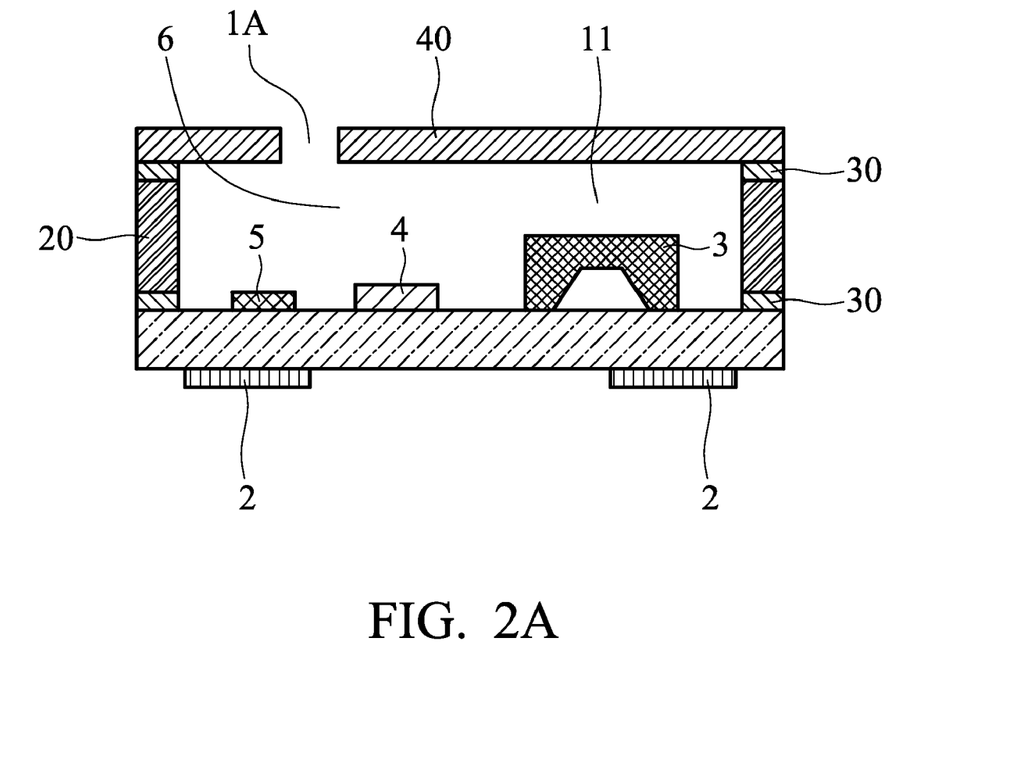
FIG. 2 is a cross-sectional view of a microphone package, without the casing, according to one embodiment of invention.
Figure 2B:
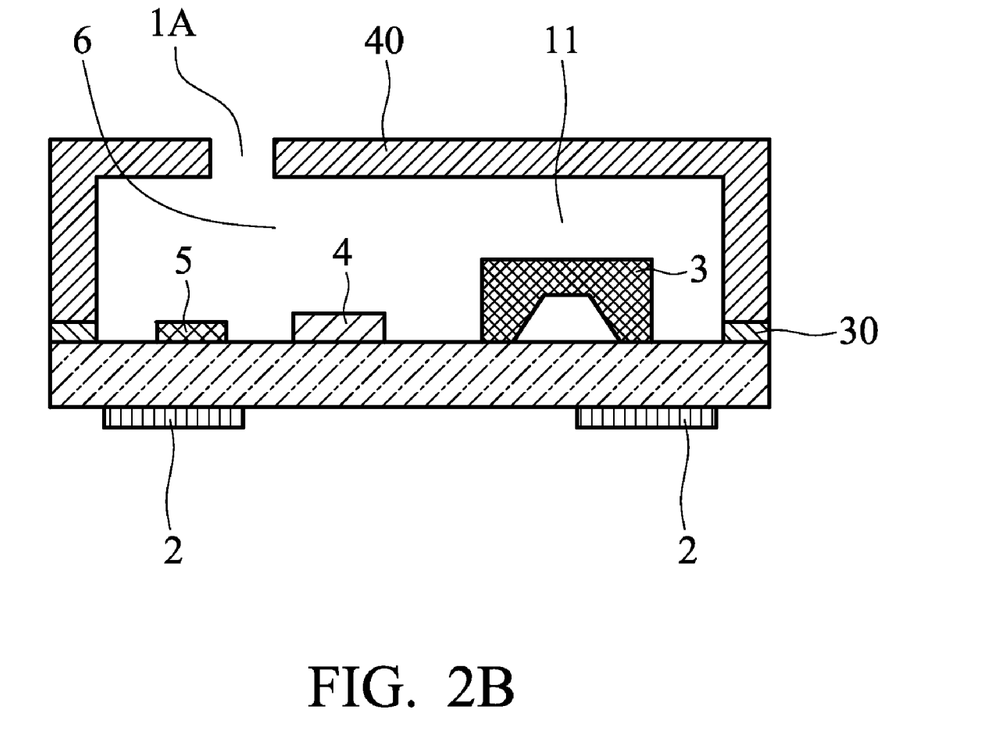

An exemplary embodiment of a microphone package without the casing 50 is illustrated in FIG. 2A. The housing wall 20 is typically glued together with the substrate 10 and the cover member 40. Alternatively, such as when using plastic materials for the housing wall 20 and the cover member 40, the housing wall 20 and the cover member 40 can form a single piece cover member 40, as shown in FIG. 2B. This cover member 40 is again glued to the substrate 10. When manufactured, the cover member 40, housing wall 20 and substrate 10 can be laminated together. In such a case, then, the glue 30 is a lamination agent that allows the bonding of the cover member 40 to the housing wall 20 and subsequently, the substrate 10.

The cover member 40 and the housing wall 20 may be a single layered material, such as plastics, or multi-layered materials, such as FR-4 materials. In either case, there is no need to sandwich a layer of conductive material in between multi-layered materials. The need for the cover member 40 and the housing wall 20 is that they form a cavity that is rugged enough to house the MEMS sensing element 3, a passive component 5 and an IC chip 4. It is preferable, though, that the cover member 40 and the housing wall 20 have high acoustic impedance.

Figure 3:
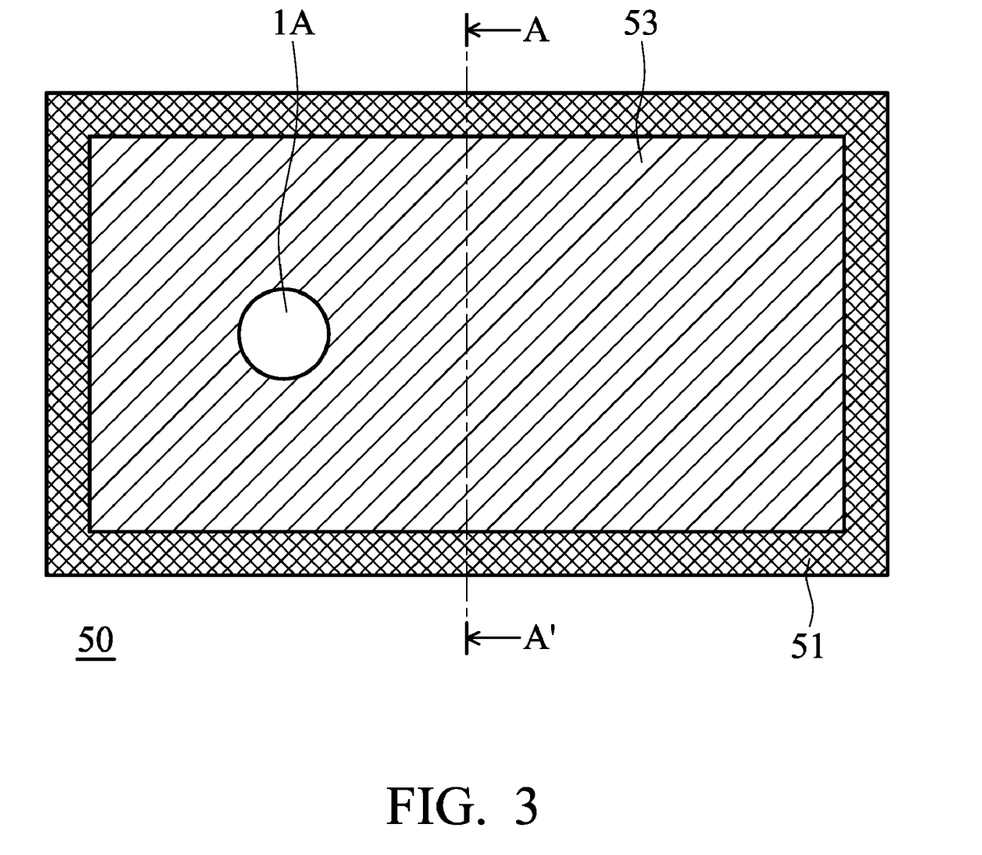
FIG. 3 is a top view of a microphone package according to one embodiment of the invention.
Figure 4:
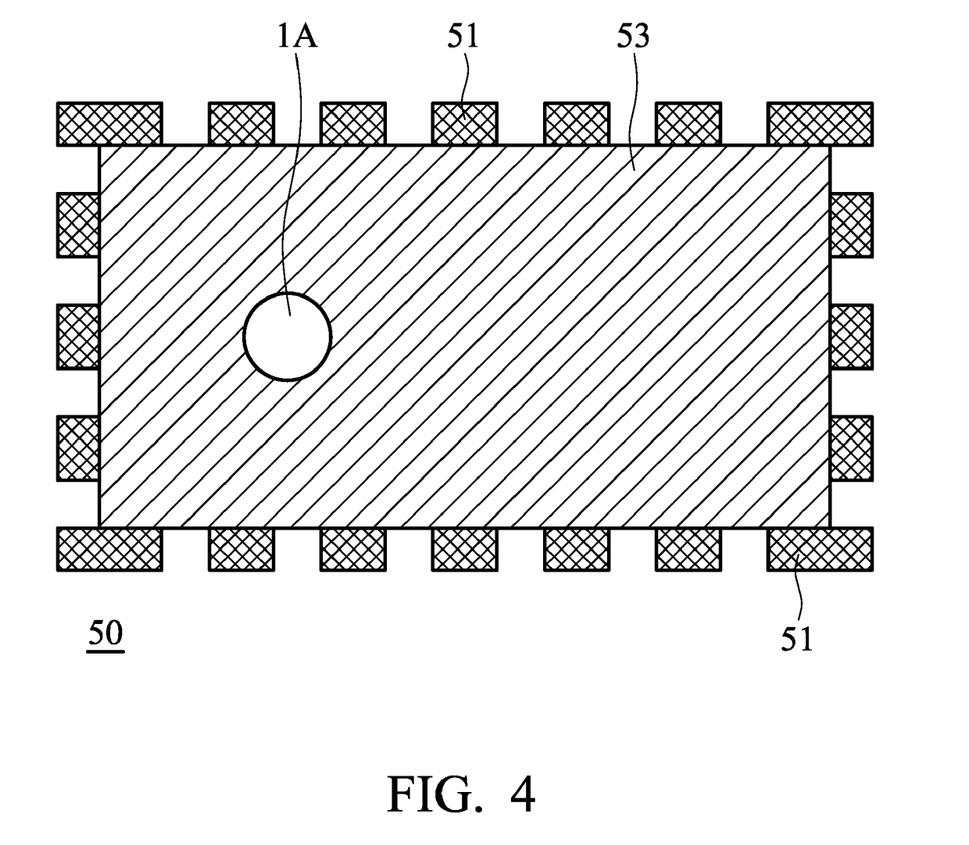
FIG. 4 is a top view of a microphone package according to another embodiment of the invention.
Figure 5:
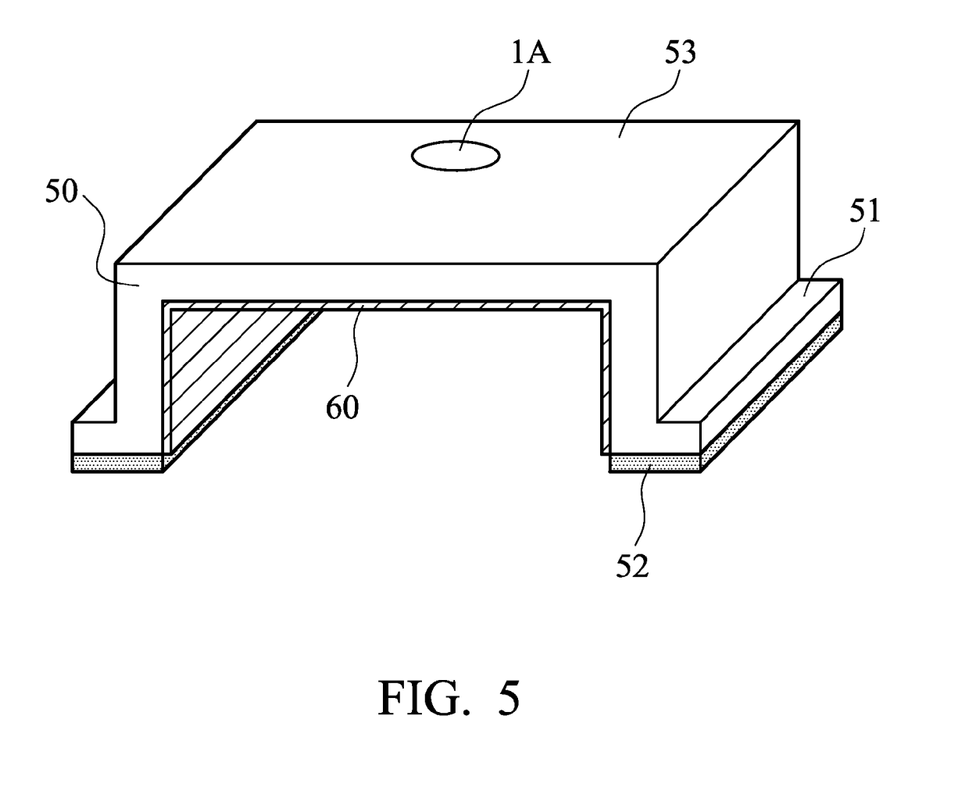
FIG. 5 is a cut-out view of the casing of the microphone package along the AA' line in FIG. 3 according to one embodiment of the invention.

FIG. 3 schematically shows the top view of the casing 50, according to one embodiment of the invention. A through opening 1A is cut through the casing 50 to allow the passage of acoustic pressure wave. The casing 50 has a top surface 53 and an edge rail 51, is typically made of sheet metals such as aluminum or other conductive materials. The casing 50 may also be made of multi-layered material. In which case, though, at least one layer of material needs to be electrically conductive. FIG. 4 schematically shows a top view of the casing 50 according to another embodiment of the invention. Here, the edge rail 51 is not continuous, but it can still be made of the same material as the top surface 53 of the casing 50.

Figure 10:
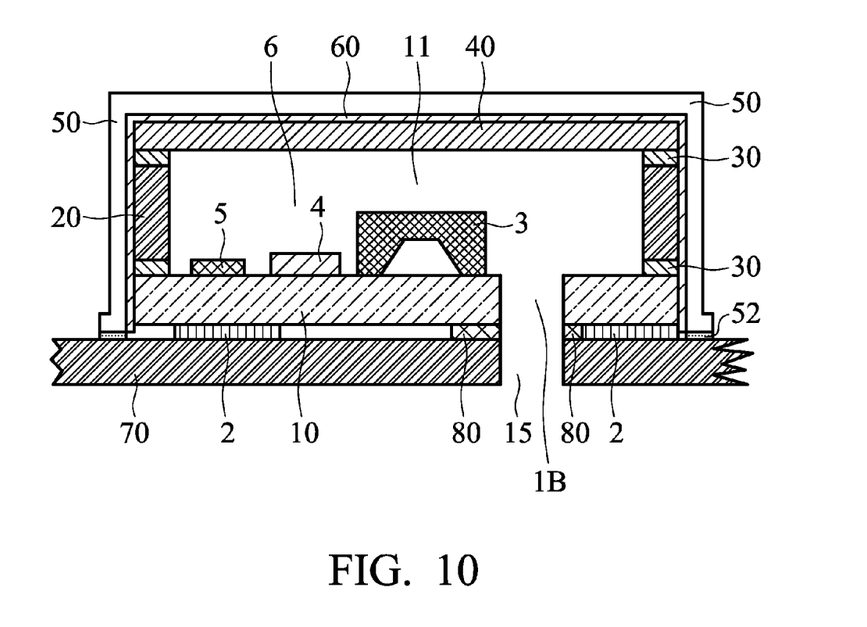
FIG. 10 is a cross-sectional view of a microphone package, being surface-mounted on a supporting PCB substrate, according to another embodiment of the invention.

According to another embodiment of the invention, as shown in FIG. 10, the MEMS microphone package has a substrate 10 on which a MEMS acoustic sensing element 3, an IC chip 4 and passive component 5 are mounted. An acoustic cavity 6 is formed by the substrate 10, housing wall 20 and a cover member 40. The attachment of housing wall 20 and cover member 40 to the substrate 10 is realized by using glue 30 which is applied between substrate 10 and housing wall 20, and between housing wall 20 and cover member 40. The height of housing wall 20 is large enough such that there is enough clearance 11 between the top surface of MEMS sensing element 3 and the cover member 40. Soldering pads 2 are formed at the bottom of the substrate 10 to allow the packaged MEMS microphone to be surface mountable onto a PCB board 70. The substrate 10 is made of FR-4 material to match the thermal property of a PCB board 70. An opening 1B is cut out from both the substrate 10 and a PCB board 70 to allow acoustic signals to pass therethrough to reach the surface of MEMS sensing element 3. In one embodiment, the opening 1B is formed in and extended through the substrate 10. The opening 1B comprises an acoustic passage connected the acoustic cavity 6 to an ambient space. The location of opening 1B is chosen such that it is away from the sensing element 3 to protect dust from falling onto or moisture, such as from the mouth of a human, to reach the surface of the sensing element 3. An acoustic opening 15, formed in and extended through the PCB board 70, is aligned with the opening 1B to allow acoustic signals passing therethrough. Acoustic sealing layer 80 is coated around the outer edge of the opening 1B to seal the gap between the substrate 10 and a PCB board 70. According to another embodiment of the invention, the acoustic sealing layer 80 is a metal solder bump, epoxy filler or rubber.

Figure 6:
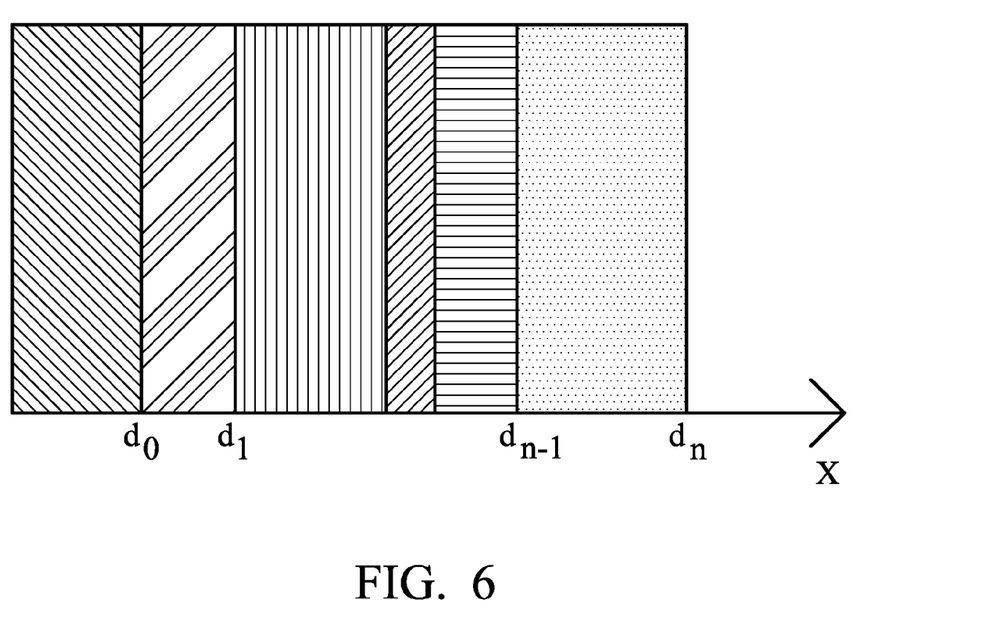
FIG. 6 is an illustration of acoustic wave propagation in a multi-layered structure.

One of the big issues for a packaged microphone is its ability to shield out unwanted acoustic noises. These noises are sometimes leaked through the side wall and the top cover of a microphone to reach the sensing element. Another embodiment of a multi-layered panel is considered as shown in FIG. 6. For a normal plane wave incidence, a transmission coefficient is given by:

$$T = \frac{m_{11}m_{22} - m_{12}m_{21}}{m_{22}}$$

where, $$\begin{bmatrix} m_{11} & m_{12} \\ m_{21} & m_{22} \end{bmatrix} = T_n T_{n-1} \ldots T_0$$

$$T_n = \frac{1}{2}\begin{bmatrix} \left(1+\frac{z_n}{z_{n+1}}\right)e^{i(k_n-k_{n+1})d_n} & \left(1-\frac{z_n}{z_{n+1}}\right)e^{-i(k_n+k_{n+1})d_n} \\ \left(1-\frac{z_n}{z_{n+1}}\right)e^{i(k_n+k_{n+1})d_n} & \left(1+\frac{z_n}{z_{n+1}}\right)e^{-i(k_n-k_{n+1})d_n} \end{bmatrix}$$

and $Z_n = \rho_n c_n$ is the impedance, $k_n = \omega c_n$ is the wave number of the $n^{th}$ layer, and $d_n$ is the position of the interface, as shown in FIG. 6. For viscoelastic materials, the c is given by:

$$c_n = \left(\frac{3G_B(\omega) + 4G_S(\omega)}{3\rho_n}\right)^{1/2}$$

where, $G_B(\omega)$ and $G_S(\omega)$ are, respectively, the complex bulk and shear modulus.

The transmission loss can then be calculated through:

$$TL = 20 \log|T(\omega)|$$

where the frequency dependence of the transmission coefficient is explicitly indicated.

Figure 7:
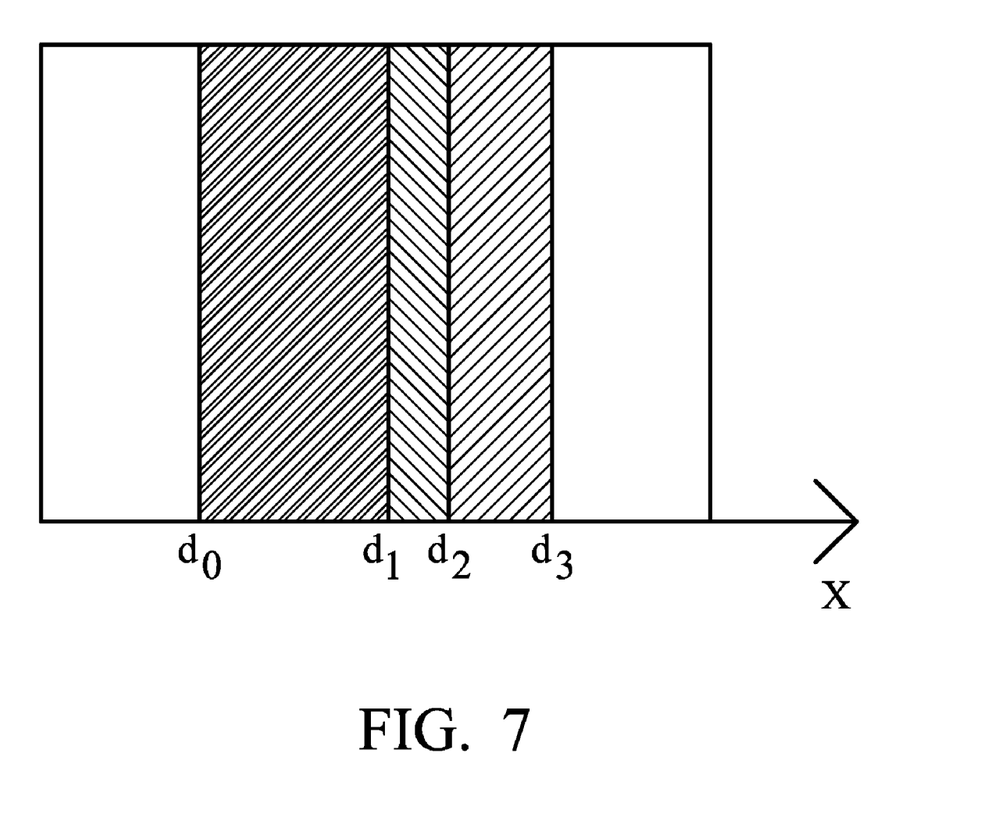
FIG. 7 schematically shows an acoustic wave transmission in a three-layered panel.
Figure 8:
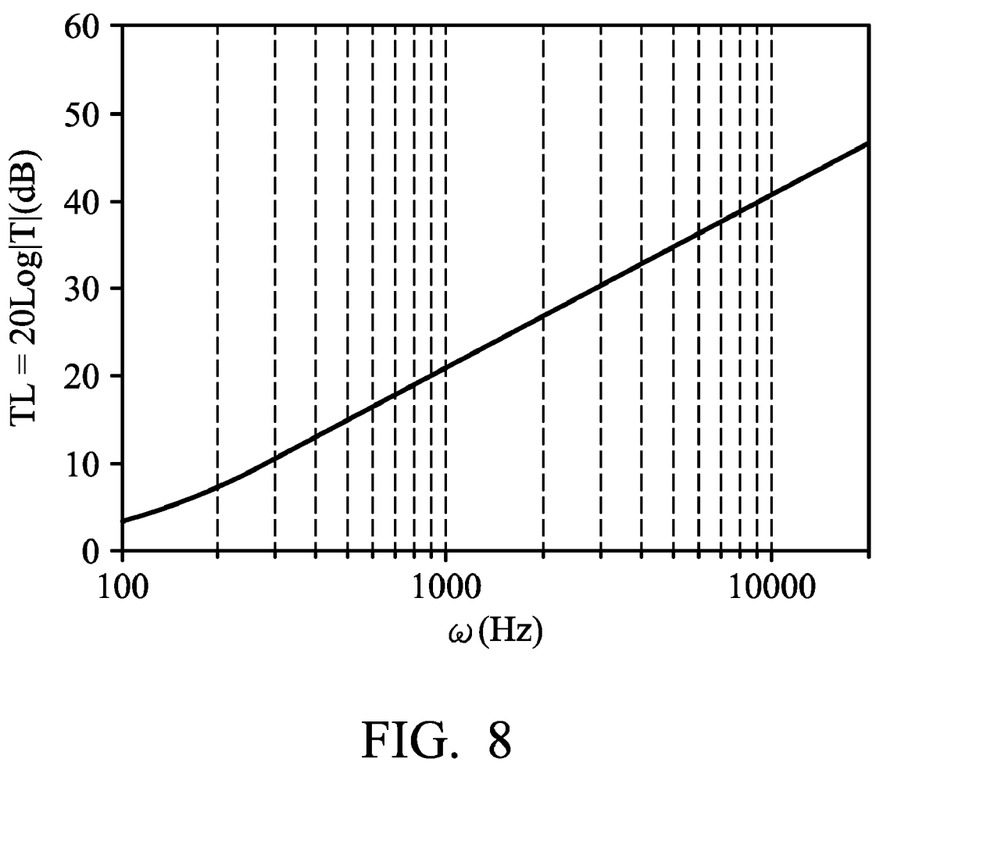
FIG. 8 is the estimated transmission loss in the three-layered panel as illustrated in FIG. 7.

For a three-layered panel (glass-polymer-glass) as shown in FIG. 7, the transmission loss is a function of frequency and plotted in FIG. 8. Here h is the thickness of each layer. The material and geometric parameters used in the calculation are given below:

$$h_1 = h_3 = 1.5 \text{ mm}, h_2 = 2.2 \text{ mm}$$

$$\rho_0 = \rho_4 = 1.2 \text{ kg/m}^3, \rho_1 = \rho_3 = 2461 \text{ kg/m}^3,$$

$$\rho_2 = 1115 \text{ kg/m}^3$$

$$c_0 = c_4 = 340 \text{ m/sec}, c_1 = c_3 = 5770 \text{ m/sec},$$

$$c_2 = \left(\frac{3G_B(\omega) + 4G_S(\omega)}{3\rho_n}\right)^{1/2}$$

$$G_S(\omega) = \mu_\infty + (\mu_0 - \mu_\infty)[1 + (i\omega\tau_0)^{1-\alpha}]^\beta$$

$$G_B(\omega) = \frac{2vG_S(\omega)}{1 - 2v}\bigg|_{v=0.4} = 4G_S(\omega)$$

$$\mu_\infty = 2.35 \times 10^8 \text{ Pa}$$

$$\mu_0 = 4.79 \times 10^5 \text{ Pa}$$

$$\alpha = 0.46$$

$$\beta = -0.1946$$

$$\tau_0 = 0.3979 \text{ sec}$$

The results in FIG. 8 indicate that with a three-layered structure as shown in FIG. 7, it is possible for a micromachined MEMS microphone package to achieve a 20 dB reduction in noise at a frequency level of 1 kHz.

Figure 9:
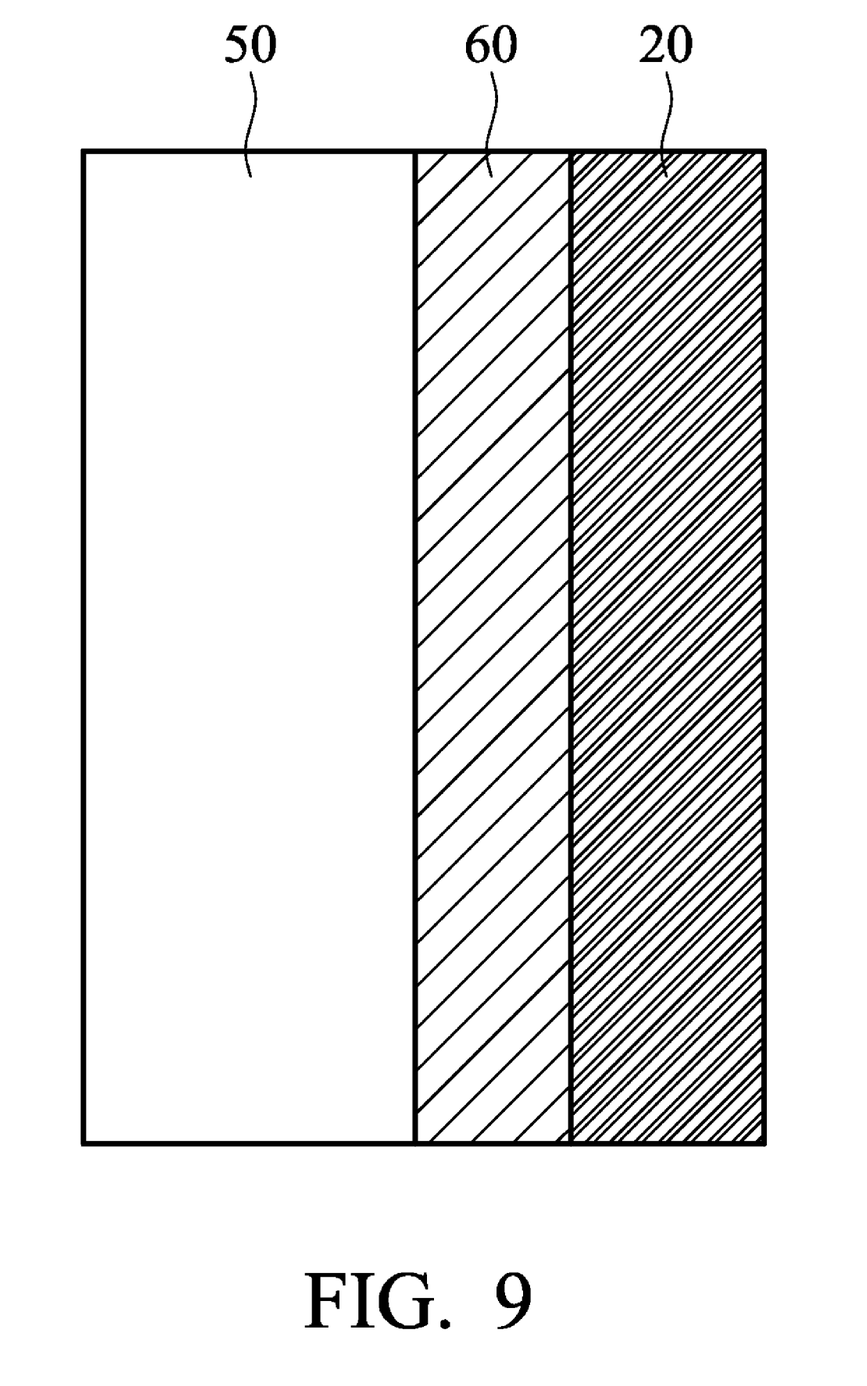
FIG. 9 is a detailed view of a side wall of a microphone package according to one embodiment of the invention.

Referring to the FIG. 9, a section of a packaged microphone side wall and the top cover is schematically illustrated. The acoustic absorption layer 60 is sandwiched between the casing 50 and the housing wall 20. In comparison with FIG. 8, it is easy to identify that this sandwiched structure is similar to the three-layered structure illustrated in FIG. 8. In a typical microphone package, though, the thickness of the casing 50 is usually on the order of 0.05 mm to 0.2 mm. And the thickness of the housing wall 20 varies from 0.1 mm to 0.5 mm. Comparing the numbers with the assumptions to obtain the graph in FIG. 8, the thickness of the housing wall 20 appears smaller than the casing 50. Note that it is possible to achieve acceptable transmission loss by selecting an appropriate acoustic absorption layer 60.

As was indicated earlier, material for the acoustic absorption layer 60 may comprise foam, cork, sponge, rubber, or spray-on silicone coating. According to an embodiment of the invention, the acoustic absorption layer 60 is a viscoelastic layer with possible voids, and is characterized by being light with slow sound speed. In other words, the acoustic absorption layer 60 has a characteristic for acoustic impedance that is much smaller when compared to that of the casing 50 and the housing wall 20 or the cover member 40.

According to another embodiment of the invention, as shown in FIG. 10, the MEMS microphone package has a substrate 10 on which a MEMS acoustic sensing element 3, an IC chip 4 and passive component 5 are mounted. An acoustic cavity 6 is formed by the substrate 10, housing wall 20 and a cover member 40. The attachment of housing wall 20 and cover member 40 to the substrate 10 is realized by using glue 30 which is applied between substrate 10 and housing wall 20, and between housing wall 20 and cover member 40. The height of housing wall 20 is large enough such that there is enough clearance 11 between the top surface of MEMS sensing element 3 and the cover member 40. Soldering pads 2 are formed at the bottom of the substrate 10 to allow the packaged MEMS microphone to be surface mountable onto a PCB board 70. The substrate 10 is made of FR-4 material to match the thermal property of a PCB board 70. An opening 1B is cut out from both the substrate 10 and a PCB board 70 to allow acoustic signals to pass therethrough to reach the surface of MEMS sensing element 3. In one embodiment, the opening 1B is formed in and extended through the substrate 10. The opening 1B comprises an acoustic passage connected the acoustic cavity 6 to an ambient space. The location of opening 1B is chosen such that it is away from the sensing element 3 to protect dust from falling onto or moisture, such as from the mouth of a human, to reach the surface of the sensing element 3. Acoustic sealing layer 80 is coated around the outer edge of the opening 1B to seal the gap between the substrate 10 and a PCB board 70. According to another embodiment of the invention, the acoustic sealing layer 80 is a metal solder bump, epoxy filler or rubber.

Referring to FIG. 10 further, a casing 50 surrounds and encloses the microphone package. An acoustic absorption layer 60 is inserted between the microphone housing wall 20 and/or top cover member 40 and the casing 50. The casing 50 is thus not directly connected to either the analog or digital ground of the microphone package. It is instead electrically connected to a common analog ground lead on a PCB board 70 through soldering pads 52.

Figure 11:
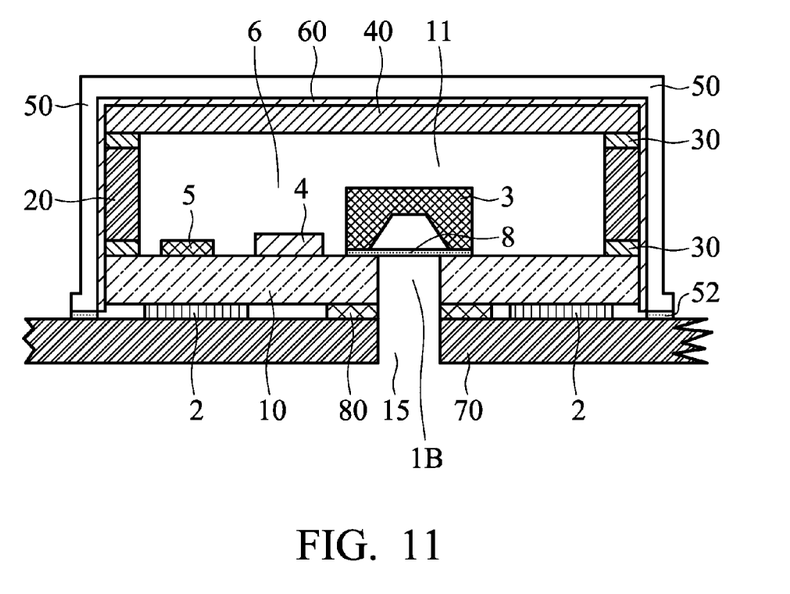
FIG. 11 is a cross-sectional view of a microphone package, being surface-mounted on a supporting PCB substrate, according to a further embodiment of the invention.

According to further another embodiment of the invention, as illustrated in FIG. 11, the MEMS microphone package has a substrate 10 on which a MEMS acoustic sensing element 3, an IC chip 4 and passive component 5 are mounted. An acoustic cavity 6 is formed by the substrate 10, housing wall 20 and a cover member 40. The attachment of housing wall 20 and cover member 40 to the substrate 10 is realized using glue 30 which is applied between substrate 10 and housing wall 20, and between housing wall 20 and cover member 40. The height of housing wall 20 is large enough such that there is enough clearance 11 between the top surface of MEMS sensing element 3 and the cover member 40. Soldering pads 2 are formed at the bottom of the substrate 10 to allow the packaged MEMS microphone to be surface mountable onto a PCB board 70. The substrate 10 is made of FR-4 material to match the thermal property of a PCB board 70. An opening 1B is cut out from both the substrate 10 and a PCB board 70 to allow acoustic signals to pass therethrough to reach the surface of MEMS sensing element 3. The opening 1B is chosen right under the MEMS sensing element 3. A screen 8 is provided between the MEMS sensing element 3 and the opening 1. The screen 8 is a perforated plate having acoustic holes ranging from 10 micrometers to 50 micrometers. According to another embodiment of the invention, the thickness of screen 8 is from 10 micrometers to 100 micrometers.

According to further another embodiment of the invention, an acoustic sealing layer 80 is coated around the outer edge of the opening 1 to seal the gap between the substrate 10 and a PCB board 70. The acoustic sealing layer 80 is a metal solder bump, epoxy filler or rubber.

Referring to FIG. 11 further, a casing 50 surrounds and encloses the microphone package. An acoustic absorption layer 60 is inserted between the microphone housing wall 20 and/or top cover member 40 and the casing 50. The casing 50 is thus not directly connected to either the analog or digital ground of the microphone package. It is instead electrically connected to a common analog ground lead on a PCB board 70 through soldering pads 52.

Some embodiments of the micromechined MEMS microphone package are advantageous in that acoustic leakage through side walls and the cover of the micromechined MEMS microphone package are effectively reduced. By connecting the conductive casing to the supporting PCB substrate, the bonding strength of the microphone package is strengthened. Also, the MEMS microphone package is not vulnerable to temperature fluctuations during the packaging and assembly process. Furthermore, due to the conductive casing that is electrically connected to a common analog ground lead of a supporting PCB board, electromagnetic interferences are shielded from the sensing element.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A MEMS microphone package, comprising:
   a cavity enclosed by a top cover part, wherein a housing wall part surrounds and supports the top cover part, and a substrate supports the housing wall part and the cover part;
   a MEMS sensing element and an IC chip disposed inside the cavity;
   an opening comprising an acoustic passage connecting the cavity to an ambient space;
   a conductive casing enclosing the top cover part and the housing wall, wherein the conductive casing is soldered to a PCB board and is electrically connected to a common analog ground lead on the PCB board; and
   an acoustic absorption layer sandwiched between the conductive casing and the cavity.

2. The MEMS microphone package as claimed in claim 1, wherein the top cover part and the housing wall part are non-conductive.

3. The MEMS microphone package as claimed in claim 1, wherein the acoustic absorption layer comprises a viscoelastic material.

4. The MEMS microphone package as claimed in claim 1, wherein the opening is formed in and extended through the top cover part, and wherein an acoustic opening formed in the conductive casing is aligned with the opening to allow acoustic signals to pass therethrough.

5. The MEMS microphone package as claimed in claim 1, wherein the opening is formed in and extended through the substrate, and wherein an acoustic opening formed in and extended through the PCB board is aligned with the opening to allow acoustic signals to pass therethrough.

6. The MEMS microphone package as claimed in claim 5, wherein the MEMS sensing element is disposed on one end of the opening.

7. The MEMS microphone package as claimed in claim 6, further comprising a perforated plate interposed between the one end of the opening and the MEMS sensing element.

8. The MEMS microphone package as claimed in claim 5, further comprising an acoustical sealer surrounding the opening and interposed between the substrate and the PCB board.

9. The MEMS microphone package as claimed in claim 1, wherein the conductive casing is isolated from a ground lead of the microphone package.

10. The MEMS microphone package as claimed in claim 1, wherein the housing wall part and the top cover member are made of an integral single cap.

11. The MEMS microphone package as claimed in claim 1, further comprising at least one passive element disposed inside the cavity.

12. The MEMS microphone package as claimed in claim 1, wherein the MEMS sensing element comprises a micromachined MEMS microphone.

* * * * *